(12) United States Patent
Kwon et al.

(10) Patent No.: US 8,431,029 B2
(45) Date of Patent: Apr. 30, 2013

(54) CIRCUIT BOARD AND METHOD OF MANUFACTURING THE SAME

(75) Inventors: Young-duck Kwon, Changwon (KR); Deok-heung Kim, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 704 days.

(21) Appl. No.: 12/492,382

(22) Filed: Jun. 26, 2009

(65) Prior Publication Data

US 2010/0000776 A1  Jan. 7, 2010

(30) Foreign Application Priority Data

Jul. 1, 2008  (KR) .................. 10-2008-0063622

(51) Int. Cl.
*H01B 13/00*  (2006.01)

(52) U.S. Cl.
USPC ............................. 216/13; 257/738

(58) Field of Classification Search ............... None
See application file for complete search history.

(56) References Cited

U.S. PATENT DOCUMENTS

| | | | | |
|---|---|---|---|---|
| 4,081,601 A | * | 3/1978 | Dinella et al. | 174/257 |
| 5,005,773 A | * | 4/1991 | Nyberg et al. | 241/30 |
| 8,049,324 B1 | * | 11/2011 | Zeta | 257/692 |
| 2004/0212088 A1 | * | 10/2004 | Chen et al. | 257/738 |
| 2008/0090494 A1 | * | 4/2008 | Lalancette et al. | 451/28 |
| 2008/0156654 A1 | * | 7/2008 | Wang et al. | 205/239 |

FOREIGN PATENT DOCUMENTS

KR  1020040106979 A  12/2004

OTHER PUBLICATIONS

Maissel et al, Handbook of Thin Film Technology, 1970, McGraw-Hill, p. 7-36 through 7-37.*

* cited by examiner

*Primary Examiner* — Binh X Tran
*Assistant Examiner* — David Cathey, Jr.
(74) *Attorney, Agent, or Firm* — Drinker Biddle & Reath LLP

(57) ABSTRACT

Provided are a circuit board and a method of manufacturing the same. The method includes: forming a pad portion and a lead line portion of a metal on an insulating substrate, wherein the lead line portion is connected to the pad portion; forming a conductive layer on the pad portion and the lead line portion, wherein the conductive layer has an upper surface comprising gold; forming an etching mask on the conductive layer so as to expose a portion corresponding to the lead line portion in the conductive layer; etching a portion of the lead line portion exposed by the etching mask and a portion of the conductive layer corresponding to the lead line portion using an etching solution containing an acid; and removing the etching mask.

11 Claims, 9 Drawing Sheets

CIRCUIT BOARD AND METHOD OF MANUFACTURING THE SAME

CROSS-REFERENCE TO RELATED PATENT APPLICATION

This application claims the benefit of Korean Patent Application No. 10-2008-0063622, filed on Jul. 1, 2008, in the Korean Intellectual Property Office, the disclosure of which is incorporated herein in its entirety by reference.

BACKGROUND

1. Field of the Invention

The present invention relates to a method of manufacturing a circuit board, and more particularly, to a method of manufacturing a circuit board used to easily etch a conductive layer.

2. Description of the Related Art

Electronic products include many components that are usually installed in a circuit board manufactured by forming a conductive layer on a substrate including an insulator and forming a circuit pattern in the conductive layer. The circuit board includes a base substrate in which an inner circuit is formed, an interlayer insulating layer, an outer circuit layer, a resist layer, and the like.

The circuit board also includes an exposed conductive layer for connection with a semiconductor, or the like. The conductive layer may include copper, but the copper may corrode or be easily oxidized. Thus, the copper is plated with nickel, and then plated again with thin gold.

When a predetermined pattern is formed on the circuit board, a conductive layer including gold is etched using photolithography. In particular, when an etch back process for etching a lead line portion to which a voltage is applied is performed in order to perform electroplating, a process for etching a conductive layer affects the quality of the circuit board. However, it is difficult to etch a conductive layer including various metals such as gold, nickel, copper, and the like.

During the process for etching the conductive layer, impurities may be generated, or the conductive layer may be overetched or underetched. Thus, it has been difficult to improve the quality of the circuit board.

SUMMARY

The present invention provides a method of manufacturing a circuit board used to easily etch a conductive layer.

According to an aspect of the present invention, there is provided a method of manufacturing a circuit board, the method including: forming a pad portion and a lead line portion of a metal on an insulating substrate, wherein the lead line portion is connected to the pad portion; forming a conductive layer on the pad portion and the lead line portion, wherein the conductive layer has an upper surface containing gold; forming an etching mask on the conductive layer so as to expose a portion corresponding to the lead line portion in the conductive layer; etching a portion of the lead line portion exposed by the etching mask and a portion of the conductive layer corresponding to the lead line portion using an etching solution containing an acid; and removing the etching mask.

According to another aspect of the present invention, there is provided a method of manufacturing a circuit board, the method including: forming first and second pad portions and a lead line portion of a metal, wherein the lead line portion is connected to the first pad portion; forming resist so as to cover the second pad portion; forming a conductive layer on the pad portion and the lead line portion and, wherein the conductive layer has an upper surface of containing gold; removing the resist; forming an etching mask so as to cover the second pad portion and a portion corresponding to the first pad portion in the conductive layer; etching a portion of the conductive layer exposed by the etching mask and the lead line portion by using an etching solution containing an acid; removing the etching mask; and performing an OSP treatment on the first pad portion.

The conductive layer may be formed by electroplating.

The etching solution may include a mixture of nitric acid and sulfuric acid or a mixture of nitric acid and hydrochloric acid.

The etching process may include etching the second conductive layer by using an iodine-potassium iodide solution and etching the first conductive layer by using an acid comprising any one selected from the group consisting of copper chloride ($CuCl_2$), iron chloride ($FeCl_3$), mixture of $H_2SO_4$ and $H_2O_2$, $Na_2(SO_4)_2$, and $NH_4(SO_4)_2$.

The etching process may include etching the second conductive layer by using cyanide and etching the first conductive layer by using an acid comprising any one selected from the group consisting of $CuCl_2$, $FeCl_3$, mixture of $H_2SO_4$ and $H_2O_2$, $Na_2(SO_4)_2$, and $NH_4(SO_4)_2$.

The cyanide may include KCN and NaCN.

The etching process may include forming a hole in the second conductive layer so as to expose the first conductive layer by rubbing alumina particles with a surface of the second conductive layer and etching the first conductive layer by using an acid comprising any one selected from the group consisting of $CuCl_2$, $FeCl_3$, mixture of $H_2SO_4$ and $H_2O_2$, $Na_2(SO_4)_2$, and $NH_4(SO_4)_2$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Exemplary embodiments according to the present invention will be described in detail with reference to the accompanying drawings and following description.

FIGS. 1 through 8 are cross-sectional views and plan views sequentially illustrating a method of manufacturing a circuit board according to an embodiment of the present invention. The method will be sequentially described with reference to FIGS. 1 through 8.

Figure 1:
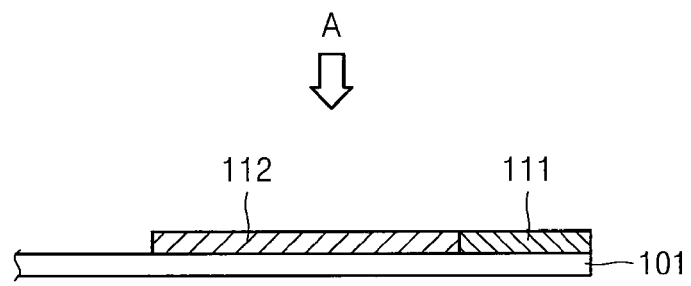
FIG. 1 is a cross-sectional view of an initial step in the formation of the circuit board.

Referring to FIG. 1, a lead line portion 111 and a pad portion 112 are formed on a substrate 101. The substrate 101 may be formed of an insulating material and include a flexible material such as a resin.

The pad portion 112 and the lead line portion 111 may be formed of the same material and include copper. The lead line portion 111 and the pad portion 112 may be formed at the same time by forming a copper layer on the substrate 101, and then by patterning the copper layer by using a mask.

The lead line portion 111 and the pad portion 112 are connected to each other, and a voltage may be supplied through the lead line portion 111 from the outside.

Figure 2:
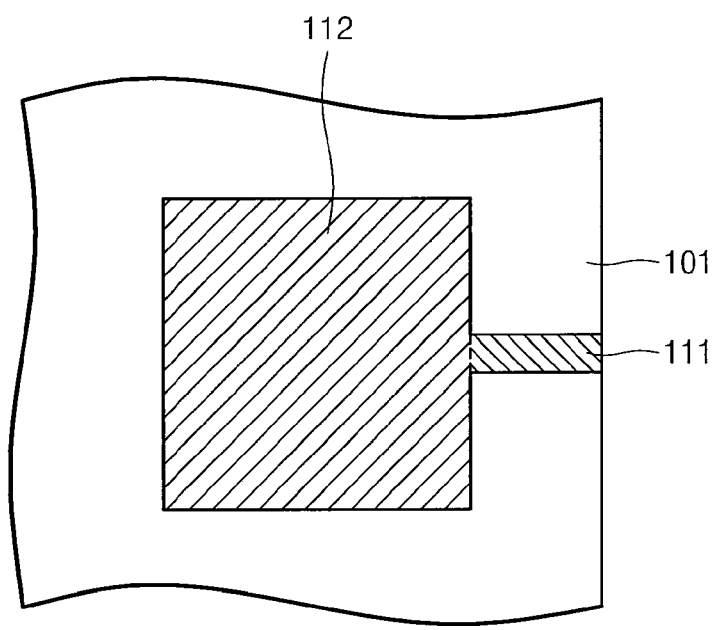
FIG. 2 is a plan view of the initial step in the formation of the circuit board.

FIG. 2 is a plan view seen from direction A of FIG. 1. The lead line portion 111 connected to the pad portion 112 extends up to an end portion of the substrate 101 so that a voltage can be applied to the lead line portion 111. Although not shown in the drawings, the lead line portion 111 may not extend up to an end portion of the substrate 101.

In FIG. 2, the pad portion 112 has a quadrilateral shape, but the present invention is not limited thereto. Thus, the pad portion 112 may have a circular shape. Also, a plurality of pad portions 112 may be formed, and in this case each of the pad portions 112 may be connected to one lead line portion 111, or the lead line portion 111 may be formed to be connected the plurality of pad portions 112.

Figure 3:
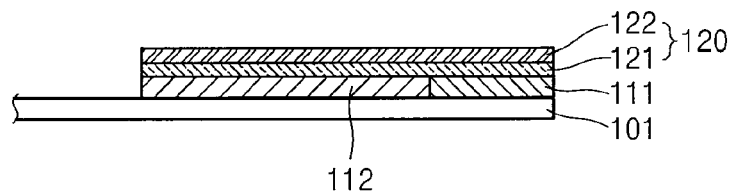
FIG. 3 is a cross-sectional view in which a conductive layer has been added.

Referring to FIG. 3, after the above process is finished, a conductive layer 120 is formed. The conductive layer 120 may be formed in a single-layered structure or a multi-layered structure. An upper surface of the conductive layer 120, that is, an upper surface of the conductive layer 120 exposed to the outside, may include gold. The conductive layer 120 of the current embodiment includes two layers, that is, a first conductive layer 121 and a second conductive layer 122. The first conductive layer 121 may include nickel and the second conductive layer 122 may include gold.

The conductive layer 120 may be formed by electroplating. The conductive layer 120 may be formed by applying a voltage through the lead line portion 111, and then by plating nickel and gold sequentially. The conductive layer 120 may be formed on the lead line portion 111 and the pad portion 112 and stacked in the same pattern as the lead line portion 111 and the pad portion 112.

Figure 4:
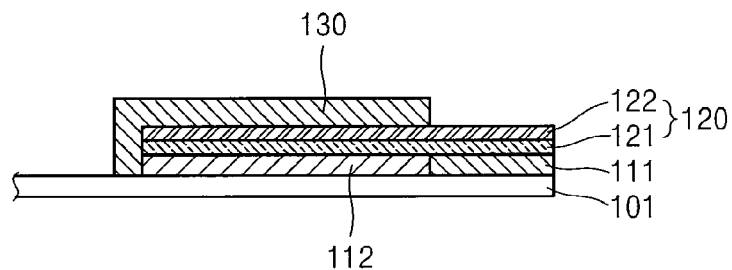
FIG. 4 is a cross-sectional view in which an etching mask has been provided.

Next, referring to FIG. 4, an etching mask 130 is formed on the conductive layer 120. The etching mask 130 is formed so as to expose a part of the conductive layer 120 corresponding to the lead line portion 111. The portion of the conductive layer 120 corresponding to the pad portion 112 is covered by the etching mask 130. A side surface of the pad portion 112 and a side surface of the conductive layer 120 which is connected to the side surface of the pad portion 112 are covered by the etching mask 130.

Figure 5:
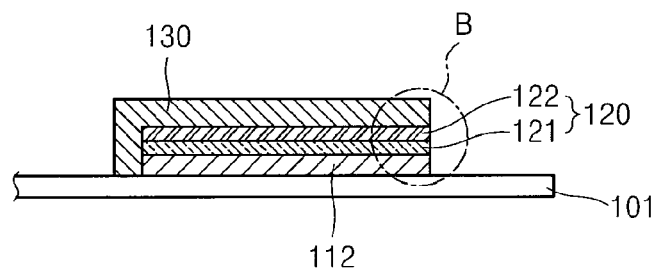
FIG. 5 is a cross-sectional view after an etching step.

Referring to FIG. 5, a portion of the conductive layer 120 not covered by the etching mask 130 and the lead line portion 111 are etched using an etching solution. This is for removing the lead line portion 111 in order to prevent a short circuit after the conductive layer 120 is formed.

In the etching process, a portion of the second conductive layer 122 not covered by the etching mask 130 is etched using an iodine-potassium iodide solution. After the second conductive layer 122 is etched, the first conductive layer 121 is etched using solution including any one selected from the group consisting of copper chloride ($CuCl_2$), iron chloride ($FeCl_3$), mixture of $H_2SO_4$ and $H_2O_2$, $Na_2(SO_4)_2$, and $NH_4(SO_4)_2$. A portion of the first conductive layer 121 corresponding to the etched portion of the second conductive layer 122 is etched. That is, portions corresponding to the lead line portion 111 in the first conductive layer 121 and the second conductive layer 122 are etched.

In the etching process of the first conductive layer 121, the lead line portion 111 disposed under the first conductive layer 121 is etched at the same time. Since material used to etch the first conductive layer 121 may etch both nickel and copper, the first conductive layer 121 and the lead line portion 111 may be simultaneously etched.

The etching process of the present invention is not limited to the above description. In another example of the etching process, a portion of the second conductive layer 122 not covered by the etching mask 130 is etched using cyanide. The cyanide may include KCN and NaCN.

After the second conductive layer 122 is etched, the first conductive layer 121 is etched using solution including any one selected from the group consisting of $CuCl_2$, $FeCl_3$, mixture of $H_2SO_4$ and $H_2O_2$, $Na_2(SO_4)_2$, and $NH_4(SO_4)_2$.

Another example of the etching process includes rubbing alumina ($Al_2O_3$) on the surface of the second conductive layer 122. The alumina is sprayed onto the second conductive layer 122 to make scratches on the surface of the second conductive layer 122. Further, minute holes, such as pin holes, are formed in the second conductive layer 122 including gold. The holes are formed to be connected to the first conductive layer 121.

Alumina particles may have a diameter in the range of 50 um to 100 um.

Next, the first conductive layer 121 is etched using solution including any one selected from the group consisting of $CuCl_2$, $FeCl_3$, mixture of $H_2SO_4$ and $H_2O_2$, $Na_2(SO_4)_2$, and $NH_4(SO_4)_2$. The solution permeates through the minute holes formed in the second conductive layer 122 and etches the first conductive layer 121, and at the same time, etches the lead line portion 111 formed under the first conductive layer 121.

When the first conductive layer 121 and the lead line portion 111 are etched and removed, the second conductive layer 122 is easily exfoliated due to the vacant space below it. Therefore, the second conductive layer 122 can be easily removed without using an additional etching solution.

Since an additional etching solution for etching the second conductive layer 122 is not necessary, an additional etching device is not necessary as well.

The number of etching solutions for etching the lead line portion 111, the first conductive layer 121, and the second conductive layer 122 may be minimized. By minimizing the number of etching solutions, differences in the etching speeds of each layer can be prevented. When the etching speed for each layer is different, the etching section of each layer becomes irregular. In particular, when the lead line portion 111 which is the lowermost layer is overetched, the first conductive layer 121 and the second conductive layer 122 disposed on the lead line portion 111 may be easily depressed.

However, in the current embodiment, by omitting an etching process of the second conductive layer 122, the etching section of each layer may have a straight line shape or a curved line shape.

In another example of the etching process, portions of the second conductive layer 122 and the first conductive layer 121, which are not covered by the etching mask 130, and the lead line portion 111 are etched using a mixture of nitric acid and sulfuric acid. The ratio of the nitric acid to the sulfuric acid may be 1 to 3.

The portions of the second conductive layer 122 and the first conductive layer 121, which are not covered by the etching mask 130, and the lead line portion 111 are etched using a mixture of nitric acid and hydrochloric acid. The ratio of the nitric acid to the hydrochloric acid may be 1 to 3.

Since the second conductive layer 122, the first conductive layer 121, and the lead line portion 111 are simultaneously etched using the mixture, the etching process can be shortened. Also, by minimizing the number of etching solutions for etching the lead line portion 111, the first conductive layer 121, and the second conductive layer 122, overetching of each layer due to the differences in the etching speed can be prevented.

That is, since the etching process is performed using only one solution, irregular etching of each layer can be prevented. Thus, the etching section of each layer may have a straight line shape or a curved line shape.

Conventionally, an etch back process for removing the lead line portion 111 is performed using a laser radiation method. However, the etch back process using a laser radiation method has problems in that the accuracy of a minute pattern can hardly be ensured and residue of the etching process remains in the section to which the laser is radiated, thereby resulting in defects of the lead line portion 111.

The lead line portion 111 may be removed using ammonia, which is a basic solution. After masking is performed on the lead line portion 111 including copper by using a dry film, an upper portion of the pad portion 112 is plated with nickel and gold to form the conductive layer 120, the dry film is removed, and then the lead line portion 111 is etched using ammonia.

Copper ions of the lead line portion 111 etched in the etching process of the lead line portion 111 by using ammonia may be extracted again from the ammonia solution. When the copper ions are extracted again from the conductive layer including gold, the electrical properties of a surface of the conductive layer 120 are deteriorated. As a result, the conductive layer 120 and semiconductor components are electrically connected to each other, thereby causing a bad connection.

Accordingly, a process for washing the surface of the conductive layer 120 is additionally required. Also, since the copper ions are extracted from the ammonia solution, concentration of the ammonia solution is hardly maintained continuously, and thus it is difficult to manage the etching process.

However, in the present invention, the lead line portion 111 is removed using the aforementioned various solutions not using an ammonia solution. Therefore, copper may be prevented from being extracted from ammonia. Also, when the lead line portion 111 is removed, the portion corresponding to the pad portion 112 is covered by the etching mask 130, and thus, pollution of the conductive layer 120 can be prevented. Therefore, an additional process for washing the surface of the conductive layer 120 is not necessary.

Figure 6:
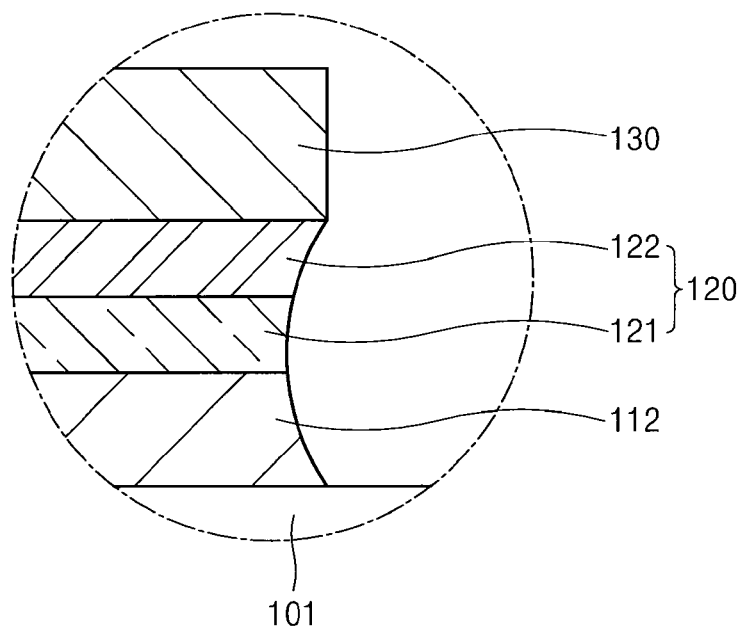
FIG. 6 is a cross-sectional enlarged view of portion B of FIG. 5.

FIG. 6 is an enlarged view of portion B of FIG. 5. FIG. 6 is a sectional view illustrating the pad portion 112, the first conductive layer 121, and the second conductive layer 122 after the etching process is finished. An etching speed of copper and nickel may be similarly controlled by using the aforementioned etching method. Accordingly, the pad portion 112 and the first conductive layer 121 can be connected to each other so as to have a gentle etching section.

Also, since the second conductive layer 122 has a similar etching speed with that of the first conductive layer 121, the second conductive layer 122 may have a gentle etching section. Conventionally, since the etching speed of the pad portion 112 is higher than that of the first conductive layer 121, the pad portion 112 disposed under the first conductive layer 121 is etched, thus the pad portion 112 is partially unoccupied. In this case, when pressure is applied from above, the first conductive layer 121 is depressed, thereby generating electrical defects. However, in the present invention, by controlling the etching speeds of the pad portion 112 and the first and second conductive layers to be similar to each other, the etching sections thereof may be connected to each other.

Figure 7:
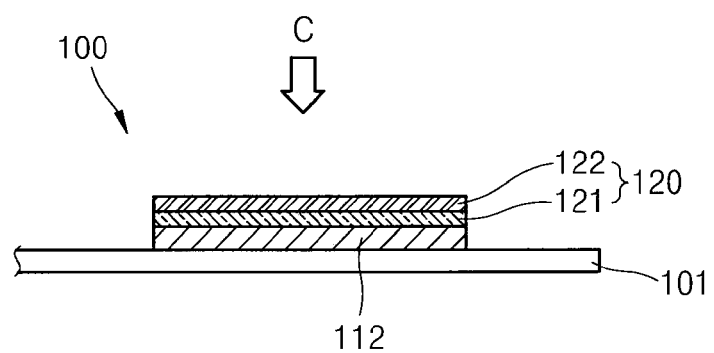
FIG. 7 is a cross-sectional view after removing the etching mask.
Figure 8:
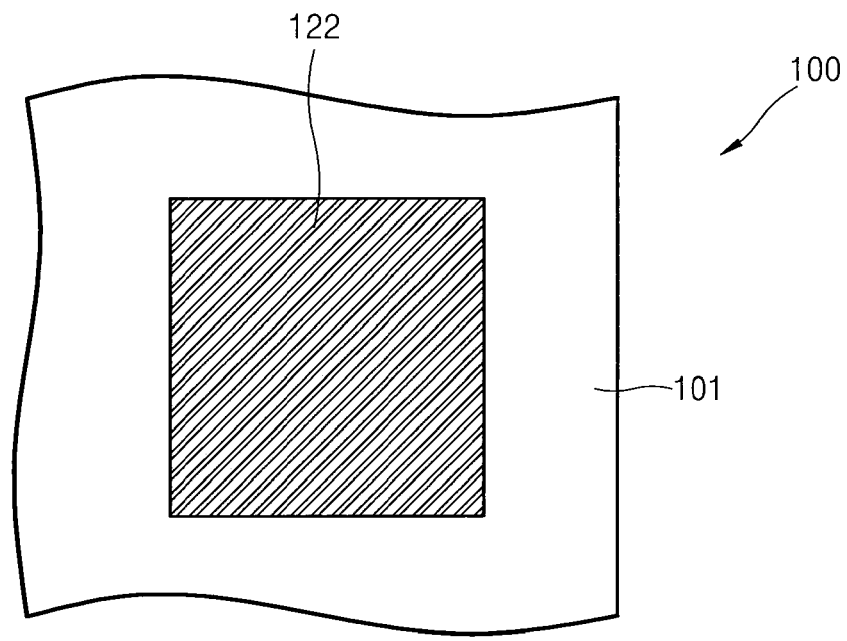
FIG. 8 is a plan view of the board shown in FIG. 7.

Referring to FIG. 7, a circuit board 100 is manufactured by removing the etching mask 130. FIG. 8 is a plan view of the circuit board 100 seen from direction C of FIG. 7. The circuit board 100 includes the first conductive layer 121 and the second conductive layer 122 which are formed on the substrate 101, the pad portion 112, and the pad portion 112. In order to prevent short of the circuit board 100, the lead line portion 111 is removed.

FIGS. 9 through 19 are cross-sectional views and plan views sequentially illustrating a method of manufacturing a circuit board according to another embodiment of the present invention. For convenience of description, differences between the aforementioned embodiments and the current embodiment will be mainly described.

Figure 10:
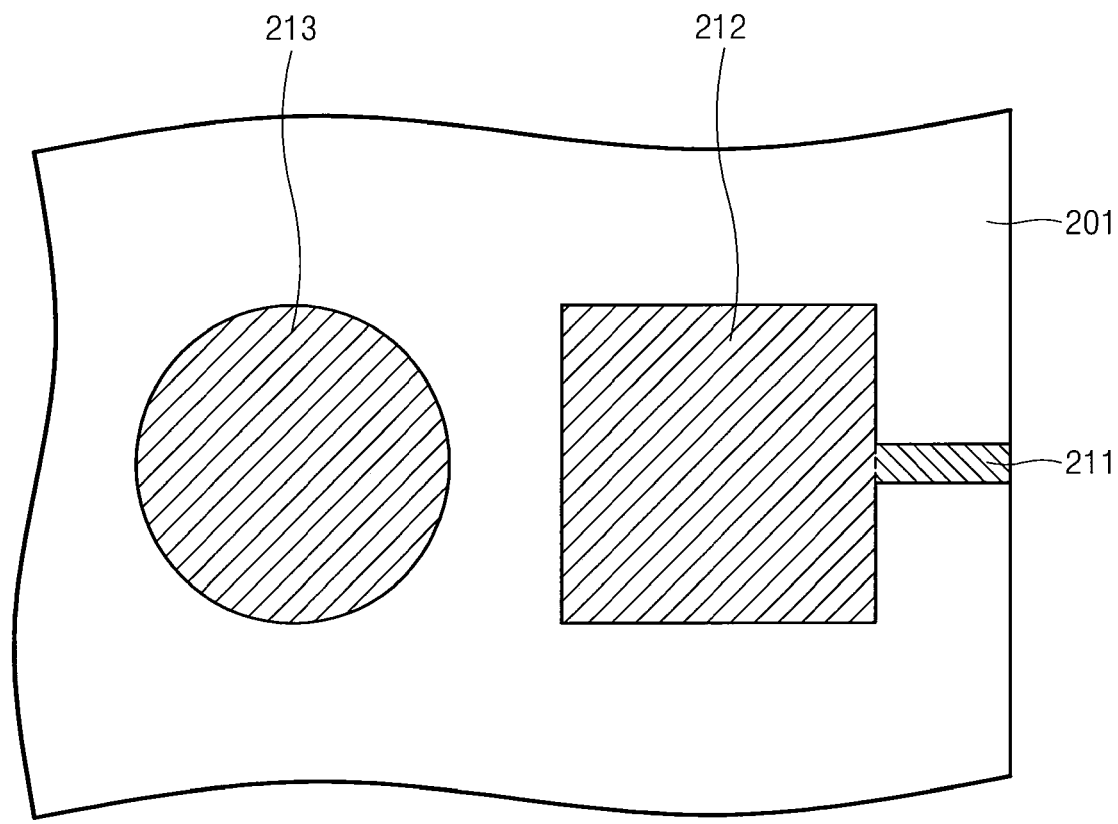
FIG. 10 is a plan view of the board in FIG. 9.

Referring to FIG. 10, a lead line portion 211, a first pad portion 212, and a second pad portion 213 are formed on a substrate 201. The substrate 201 is formed of insulating material, and may include flexible material such as resin.

The first pad portion 212, the second pad portion 213, and the lead line portion 211 are formed of the same material, and may include copper, respectively.

The lead line portion 211, the first pad portion 212, and the second pad portion 213 may be formed at the same time by forming a copper film on the substrate 201, then patterning the copper film by using a mask.

The lead line portion 211 is connected to the first pad portion 212, and voltage may be applied through the lead line portion 211 from outside. The second pad portion 213 may not be connected to the first pad portion 212.

Figure 9:
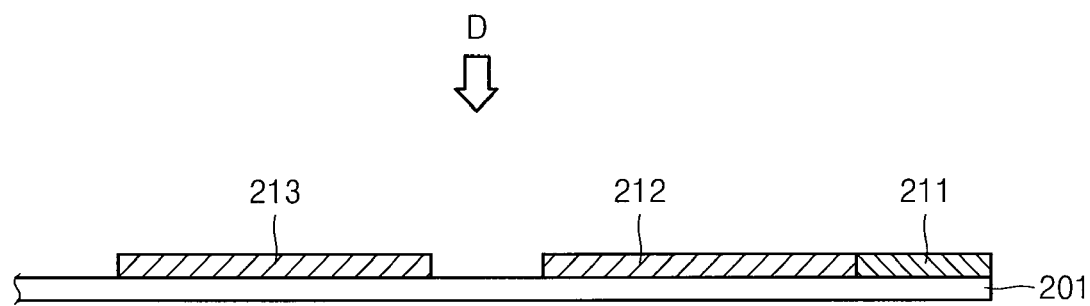
FIG. 9 is a cross-sectional view of the circuit board according to an additional embodiment of the invention.

FIG. 10 is a plan view seen from direction D of FIG. 9. The lead line portion 211 connected to the first pad portion 212 extends up to an end portion of the substrate 201. In FIG. 10, the first pad portion 212 has a quadrilateral shape, and the second pad portion 213 has a circular shape, but the present invention is not limited thereto. The first pad portion 212 and the second pad portion 213 may have various shapes depending on the process conditions and the applications of the circuit board 100, and may have the same plane shapes or different shapes.

A plurality of the first pad portions 212 and second pad portions 213 may be formed. In FIG. 10, only one lead line portion 211 is connected to one first pad portion 212, but the lead line portion 211 may be formed so as to be connected to a plurality of first pad portions 212.

In FIG. 10, the first pad portion 212 and the second pad portion 213 are formed on the same plane, but may be respectively formed on different planes, and thus the circuit board may be used for different applications.

Figure 11:
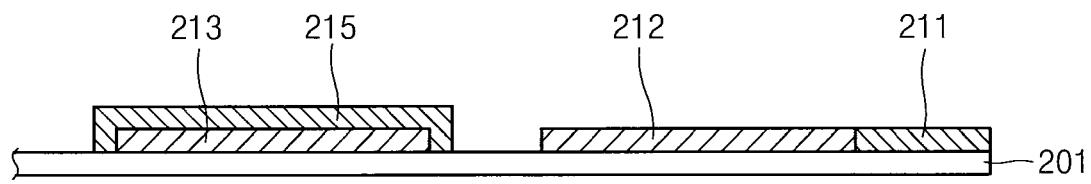
FIG. 11 is a cross-sectional view showing a resist formed to cover a second pad portion.

Next, referring to FIG. 11, a resist 215 is formed so as to cover the second pad portion 213. The resist 215 may have a sufficient thickness and width so as to completely cover the second pad portion 213, but should not cover the lead line portion 211 and the first pad portion 212. The resist 215 may be formed of any material as long as the resist 215 functions to protect the second pad portion 213 when a conductive layer is formed later on.

Figure 12:
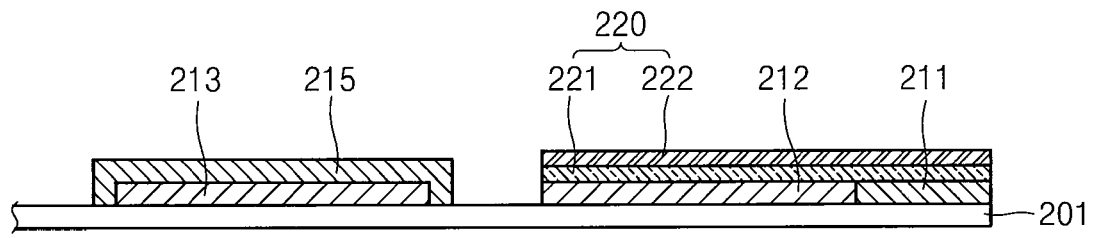
FIG. 12 is a cross-sectional view showing the addition of a conductive layer.

Next, referring to FIG. 12, the conductive layer 220 may be formed in a single-layered structure or a multi-layered structure. An outermost layer of the conductive layer 220, that is, an outermost portion of the conductive layer 220 may include gold. In the current embodiment, the conductive layer 220 is formed of two layers, that is, a first conductive layer 221 and a second conductive layer 222. The first conductive layer 221 includes nickel and the second conductive layer 222 includes gold.

The conductive layer 220 may be formed by electroplating. The conductive layer 220 may be formed by applying a voltage through the lead line portion 211, and then by plating nickel and gold sequentially. The conductive layer 220 is formed on the lead line portion 211 and the pad portion 212, and is stacked in the same pattern as the lead line portion 211 and the pad portion 212.

Figure 13:
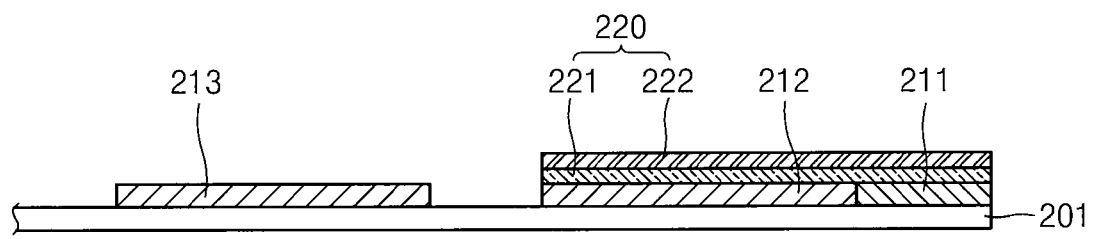
FIG. 13 is a cross-sectional view after removing the resist.

Next, referring to FIG. 13, the resist 215 is exfoliated. Consequently, the conductive layer 220 is not formed on the second pad portion 213, and formed only on the lead line portion 211 and the pad portion 212.

Figure 14:
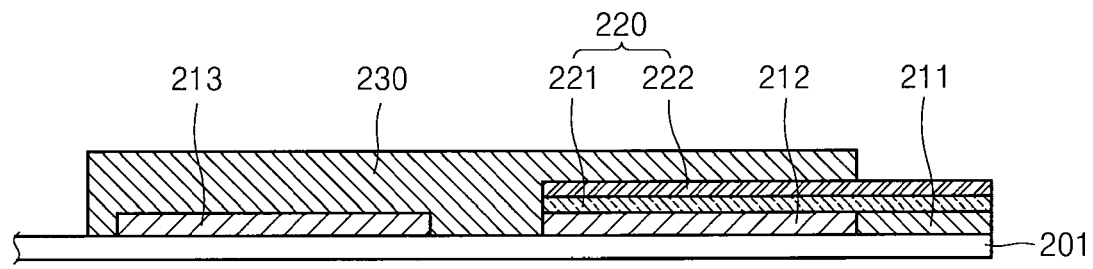
FIG. 14 is a cross-sectional view with the addition of an etching mask.

Next, referring to FIG. 14, an etching mask 230 is formed so as to expose a portion corresponding to the lead line portion 211 in the conductive layer 220. That is, the etching mask 230 is formed so as to cover the second pad portion 213 and a portion corresponding to the first pad portion 212 in the conductive layer 220.

Figure 15:
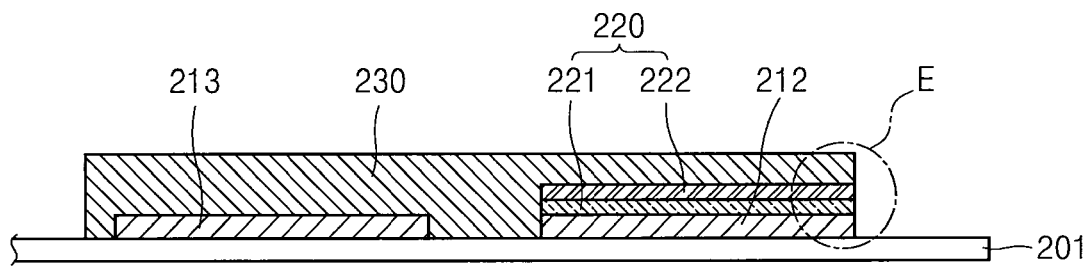
FIG. 15 is a cross-sectional view showing the results of an etching process.

Next, referring to FIG. 15, a portion of the conductive layer 220 which is not covered by the etching mask 230 and the lead line portion 211 are etched using an etching solution in order to remove the lead line portion 111 and prevent a short circuit after the conductive layer 220 is formed.

In the etching process, a portion of the second conductive layer 222 which is not covered by etching mask 230 is etched using an iodine-potassium iodide solution. After the second conductive layer 222 is etched, the first conductive layer 221 is etched using solution including any one selected from the group consisting of $CuCl_2$, $FeCl_3$, mixture of $H_2SO_4$ and $H_2O_2$, $Na_2(SO_4)_2$, and $NH_4(SO_4)_2$. A portion of the first conductive layer 221 corresponding to the etched portion of the second conductive layer 222 is etched. That is, a portion corresponding to the lead line portion 211 in the first conductive layer 221 and the second conductive layer 222 is etched.

In the etching process of the first conductive layer 221, the lead line portion 211 disposed under the first conductive layer 221 is simultaneously etched.

The etching process of the present embodiment is not limited to the above description. In another example of the etching process, a portion of the second conductive layer 222 which is not covered by the etching mask 230 is etched using cyanide. The cyanide may include KCN and NaCN.

After the second conductive layer 222 is etched, the first conductive layer 221 is etched using solution including any one selected from the group consisting of $CuCl_2$, $FeCl_3$, mixture of $H_2SO_4$ and $H_2O_2$, $Na_2(SO_4)_2$, and $NH_4(SO_4)_2$.

Another example of the etching process includes rubbing alumina ($Al_2O_3$) on a surface of the second conductive layer 222. The alumina is sprayed onto the second conductive layer 222 to make scratches on the surface of the second conductive layer 222. Further, minute holes, such as a pin hole, are formed in the second conductive layer 222 including gold. The holes are formed to be connected to the first conductive layer 221.

Next, the first conductive layer 221 is etched using solution including any one selected from the group consisting of $CuCl_2$, $FeCl_3$, mixture of $H_2SO_4$ and $H_2O_2$, $Na_2(SO_4)_2$, and $NH_4(SO_4)_2$. The solution permeates through the minute holes formed in the second conductive layer 222. The permeating solution etches the first conductive layer 221, and the lead line portion 211 formed under the first conductive layer 221 is simultaneously etched. The same effects as described in the aforementioned embodiment will not be repeated.

In another example of the etching process, portions of the second conductive layer 222 and the first conductive layer 221 not covered by the etching mask 230 and the lead line portion 211 are etched using mixture of nitric acid and sulfuric acid. The ratio of the nitric acid to the sulfuric acid may be 1 to 3.

The portions of the second conductive layer 222 and the first conductive layer 221 not covered by the etching mask 230 and the lead line portion 211 are etched using a mixture of nitric acid and hydrochloric acid. The ratio of the nitric acid to the hydrochloric acid may be 1 to 3. Since the second conductive layer 222, the first conductive layer 221, and the lead line portion 211 are simultaneously etched using one mixture, the duration of the etching process can be shortened.

The same effects as described in the aforementioned embodiment will not be repeated.

Figure 16:
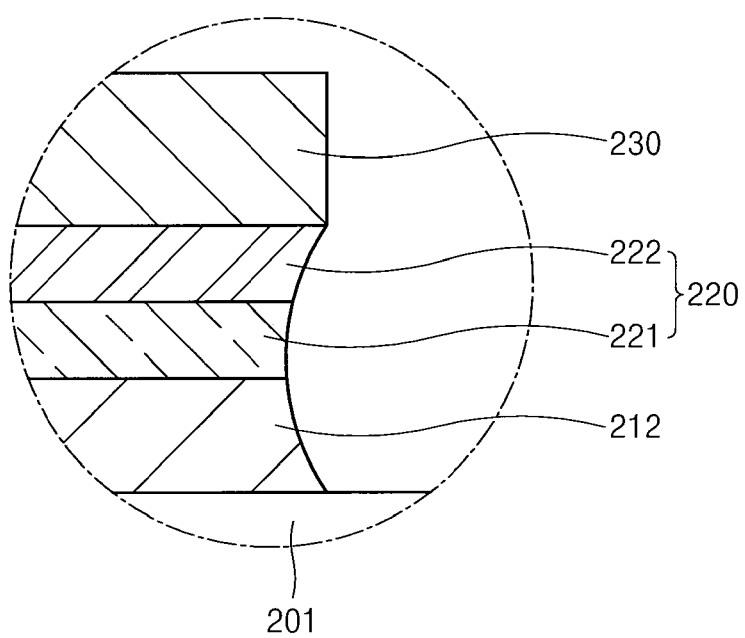
FIG. 16 is a cross-sectional enlarged view of portion E of FIG. 15.

FIG. 16 is an enlarged view of portion E of FIG. 15. FIG. 16 is a sectional view illustrating the first pad portion 212, the first conductive layer 221, and the second conductive layer 222 after the etching process is performed. Etching speeds of copper and nickel may be controlled to be similar to each other by using the aforementioned solutions. Accordingly, the pad portion 212 and the first conductive layer 221 can be connected to each other so as to have a gentle etching section.

Also, since the second conductive layer 222 has a similar etching speed with that of the first conductive layer 221, the second conductive layer 222 may have a gentle etching section. The same description as in the aforementioned embodiment will not be repeated.

Figure 17:
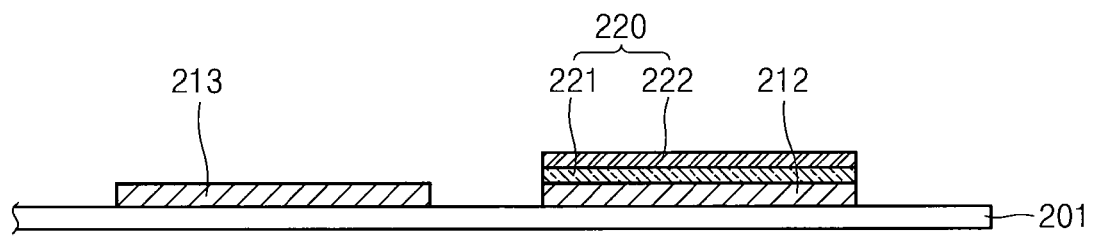
FIG. 17 is a cross-sectional view with the etching mask removed.
Figure 18:
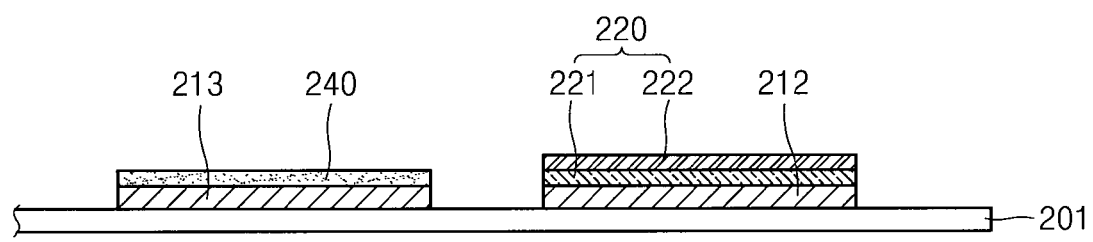
FIG. 18 is a cross-sectional view showing the addition of a treatment surface.

Next, referring to FIG. 17, the etching mask 230 is removed. The conductive layer 220 is formed on the first pad portion 212 and is not formed on the second pad portion 213. Referring to FIG. 18, an organic solderability preservative (OSP) treatment surface 240 is formed on the second pad portion 240. The OSP, which is a water-soluble antioxidant, is spread on the second pad portion 213 to prevent oxidation of the second pad portion 213. Since the OSP is optionally spread only on copper, the OSP treatment surface 240 may be easily formed on the surface of the second pad portion 213.

Figure 19:
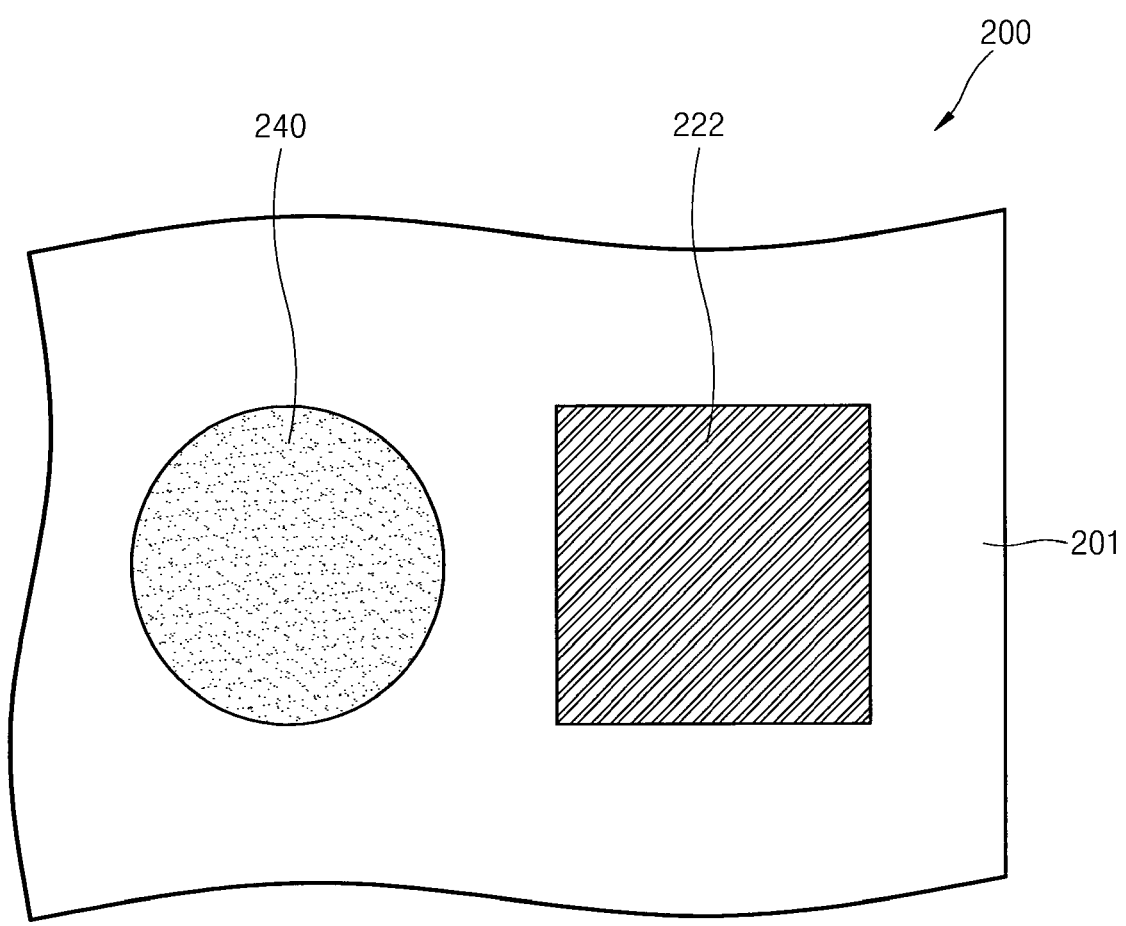
FIG. 19 is a plan view showing the resultant circuit board.

FIG. 19 is a plan view of the circuit board 200 seen from direction F of FIG. 18. The circuit board 200 includes the substrate 201, the first pad portion 212, the first conductive layer 221 and the second conductive layer 222 which are formed on the first pad portion 212, and the second pad portion 213. In order to prevent short of the circuit board 200, the lead line portion 211 is removed. The OSP treatment surface 240 is formed on the second pad portion 213. The circuit board 200 including pad portions having different surfaces can be formed using a method according to the current embodiment.

That is, the conductive layer 220 is formed on the first pad portion 212, and the OSP treatment surface 240 may be easily formed on the second pad portion 213.

According to the present invention, a conductive layer can be easily etched using a method of manufacturing a circuit board.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of components configured to perform the specified functions.

The particular implementations shown and described herein are illustrative examples of the invention and are not intended to otherwise limit the scope of the invention in any way. For the sake of brevity, conventional aspects may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context.

The word mechanism is intended to be used generally and is not limited solely to mechanical embodiments. Numerous modifications and adaptations will be readily apparent to those skilled in this art without departing from the spirit and scope of the present invention.

What is claimed is:

1. A method of manufacturing a circuit board, the method comprising:
    forming a first pad portion, a second pad portion, and a lead line portion of a metal on an insulating substrate, wherein the lead line portion is connected to the first pad portion, and the second pad portion has no lead line;
    forming resist to cover the second pad portion on the substrate wherein the resist is the only layer above the second pad portion, relative to the substrate, during the forming of the resist;
    forming a conductive layer only on the first pad portion and the lead line portion, wherein the conductive layer has an upper surface comprising gold;
    removing the resist;
    forming an etching mask on the conductive layer to cover the second pad portion and the first pad portion, and to expose a portion corresponding to the lead line portion in the conductive layer;
    etching a portion of the lead line portion exposed by the etching mask and a portion of the conductive layer corresponding to the lead line portion using an etching solution containing an acid; and
    removing the etching mask.

2. The method of claim 1, wherein the conductive layer is formed by electroplating.

3. The method of claim 1, wherein the etching solution comprises: a) a mixture of nitric acid and sulfuric acid; or b) a mixture of nitric acid and hydrochloric acid.

4. The method of claim 1, wherein:
    the conductive layer comprises a first conductive layer comprising nickel, and a second conductive layer comprising gold, these conductive layers being arranged so that the first conductive layer is between the second conductive layer and the pad portion or the lead line portion; and
    the etching process comprises etching the second conductive layer by using an iodine-potassium iodide solution and etching the first conductive layer by using an acid selected from the group consisting of copper chloride ($CuCl_2$), iron chloride ($FeCl_3$), mixture of $H_2SO_4$ and $H_2O_2$, $Na_2(SO_4)_2$, and $NH_4(SO_4)_2$.

5. The method of claim 1, wherein:
    the conductive layer comprises a first conductive layer comprising nickel, and a second conductive layer comprising gold, these conductive layers being arranged so that the first conductive layer is between the second conductive layer and the pad portion or the lead line portion; and
    the etching process comprises etching the second conductive layer by using cyanide and etching the first conductive layer by using an acid selected from the group consisting of $CuCl_2$, $FeCl_3$, mixture of $H_2SO_4$ and $H_2O_2$, $Na_2(SO_4)_2$, and $NH_4(SO_4)_2$.

6. The method of claim 1, wherein:
    the conductive layer comprises a first conductive layer comprising nickel, and a second conductive layer comprising gold, these conductive layers being arranged so that the first conductive layer is between the second conductive layer and the pad portion or the lead line portion; and
    the etching process comprises forming a hole in the second conductive layer so as to expose the first conductive layer by rubbing alumina particles on a surface of the second conductive layer and etching the first conductive layer by using an acid selected from the group consisting of $CuCl_2$, $FeCl_3$, mixture of $H_2SO_4$ and $H_2O_2$, $Na_2(SO_4)_2$, and $NH_4(SO_4)_2$.

7. The method of claim 1, further comprising:
    performing an organic solderability preservative (OSP) treatment on the second pad portion.

8. The method of claim 7, wherein the conductive layer is formed by electroplating.

9. The method of claim 7, wherein:
    the conductive layer comprises a first conductive layer comprising nickel, and a second conductive layer comprising gold, these conductive layers being arranged so that the first conductive layer is between the second conductive layer and the pad portion or the lead line portion; and
    the etching process comprises etching the second conductive layer by using an iodine-potassium iodide solution and etching the first conductive layer by using an acid selected from the group consisting of $CuCl_2$, $FeCl_3$, mixture of $H_2SO_4$ and $H_2O_2$, $Na_2(SO_4)_2$, and $NH_4(SO_4)_2$.

10. The method of claim 7, wherein:

the conductive layer comprises a first conductive layer comprising nickel, and a second conductive layer comprising gold, these conductive layers being arranged so that the first conductive layer is between the second conductive layer and the pad portion or the lead line portion; and the etching process comprises etching the second conductive layer by using cyanide and etching the first conductive layer by using an acid selected from the group consisting of $CuCl_2$, $FeCl_3$, mixture of $H_2SO_4$ and $H_2O_2$, $Na_2(SO_4)_2$, and $NH_4(SO_4)_2$.

11. The method of claim 7, wherein:

the conductive layer comprises a first conductive layer comprising nickel, and a second conductive layer comprising gold, these conductive layers being arranged so that the first conductive layer is between the second conductive layer and the pad portion or the lead line portion; and the etching process comprises forming a hole in the second conductive layer so as to expose the first conductive layer by rubbing alumina particles on a surface of the second conductive layer and etching the first conductive layer by using an acid selected from the group consisting of $CuCl_2$, $FeCl_3$, mixture of $H_2SO_4$ and $H_2O_2$, $Na_2(SO_4)_2$, and $NH_4(SO_4)_2$.

* * * * *